US010737930B2

(12) United States Patent
Grutzeck et al.

(10) Patent No.: US 10,737,930 B2
(45) Date of Patent: Aug. 11, 2020

(54) MICROMECHANICAL SPRING DEVICE AND METHOD FOR MANUFACTURING A MICROMECHANICAL SPRING DEVICE

(71) Applicant: Robert Bosch GmbH, Stuttgart (DE)

(72) Inventors: Helmut Grutzeck, Kusterdingen (DE); Frederic Njikam Njimonzie, Reutlingen (DE); Hendrik Specht, Pliezhausen (DE); Joerg Muchow, Reutlingen (DE); Massimiliano Putignano, Reutlingen (DE); Odd-Axel Pruetz, Nuertingen (DE)

(73) Assignee: Robert Bosch GmbH, Stuttgart (DE)

( * ) Notice: Subject to any disclaimer, the term of this patent is extended or adjusted under 35 U.S.C. 154(b) by 190 days.

(21) Appl. No.: 15/569,966

(22) PCT Filed: Apr. 1, 2016

(86) PCT No.: PCT/EP2016/057222
§ 371 (c)(1),
(2) Date: Oct. 27, 2017

(87) PCT Pub. No.: WO2016/184594
PCT Pub. Date: Nov. 24, 2016

(65) Prior Publication Data
US 2018/0155185 A1 Jun. 7, 2018

(30) Foreign Application Priority Data
May 18, 2015 (DE) .................. 10 2015 209 030

(51) Int. Cl.
*B81B 3/00* (2006.01)
*F16F 7/104* (2006.01)
(Continued)

(52) U.S. Cl.
CPC .......... *B81B 3/0045* (2013.01); *B81C 99/006* (2013.01); *F16F 1/027* (2013.01);
(Continued)

(58) Field of Classification Search
CPC ............ B81B 3/0045; B81B 2201/042; B81B 2201/0242; B81B 2203/0163;
(Continued)

(56) References Cited

U.S. PATENT DOCUMENTS 8,614,110 B1 * 12/2013 Waters ................ G01P 15/0802
257/E23.002
2012/0297876 A1   11/2012 Gauger et al.
(Continued)

FOREIGN PATENT DOCUMENTS

DE    102011076555 A1   11/2012
JP    2000330067 A      11/2000
(Continued)

OTHER PUBLICATIONS

International Search Report dated Jun. 28, 2016, of the corresponding International Application PCT/EP2016/057222 filed Apr. 1, 2016.

*Primary Examiner* — Kimberly N. Kakalec
(74) *Attorney, Agent, or Firm* — Norton Rose Fulbright US LLP; Gerard Messina

(57) ABSTRACT

A micromechanical device and a corresponding manufacturing method. The micromechanical device includes: a spring element which is moveably coupleable or is moveably coupled to a frame unit at at least one connecting point of the spring element, the spring element including at least one web, which extends outward from the at least one connecting point; and the at least one web being structured in such a way that it includes at least one first section as well as at least one widening section for reducing a non-linearity (Continued)

of the spring element, which is widened compared to the first section.

13 Claims, 3 Drawing Sheets

(51) Int. Cl.
*F16F 1/02* (2006.01)
*B81C 99/00* (2010.01)
*F16F 1/373* (2006.01)
*G02B 26/08* (2006.01)

(52) U.S. Cl.
CPC ............ F16F 1/3737 (2013.01); F16F 7/104 (2013.01); G02B 26/0833 (2013.01); *B81B 2201/0242* (2013.01); *B81B 2201/042* (2013.01); *B81B 2203/0163* (2013.01); *B81B 2203/058* (2013.01)

(58) Field of Classification Search
CPC ....... B81B 2203/058; B81B 2203/0145–0172; F16F 7/104; F16F 1/027; F16F 1/3737; G02B 26/0833; G02B 26/105; B81C 99/006
See application file for complete search history.

(56) References Cited

U.S. PATENT DOCUMENTS

| | | |
|---|---|---|
| 2013/0107339 A1 | 5/2013 | Horie et al. |
| 2014/0139898 A1* | 5/2014 | Yamada ............ G02B 26/0858 359/199.1 |
| 2015/0036203 A1 | 2/2015 | Nitsche et al. |

FOREIGN PATENT DOCUMENTS

| | | |
|---|---|---|
| JP | 2004202683 A | 7/2004 |
| JP | 2004530926 A | 10/2004 |
| JP | 2007525025 A | 8/2007 |
| JP | 2009175511 A | 8/2009 |
| JP | 2011104768 A | 6/2011 |
| JP | 2011128245 A | 6/2011 |
| JP | 2012058662 A | 3/2012 |
| JP | 2012113043 A | 6/2012 |
| WO | 2009033914 A1 | 3/2009 |
| WO | 2010115445 A1 | 10/2010 |
| WO | 2014192123 A1 | 12/2014 |

* cited by examiner

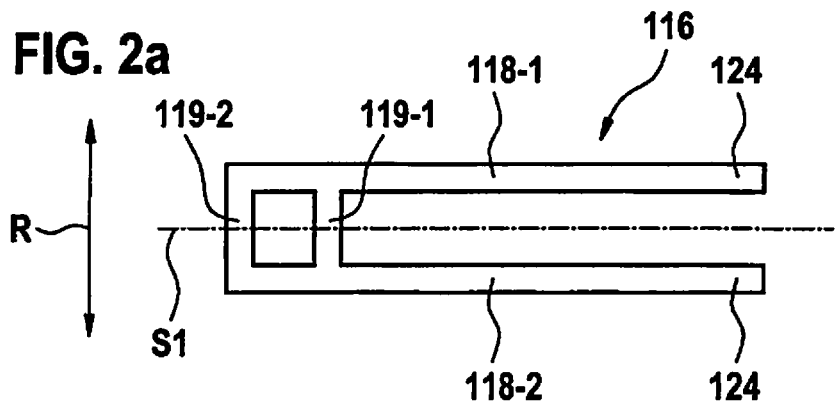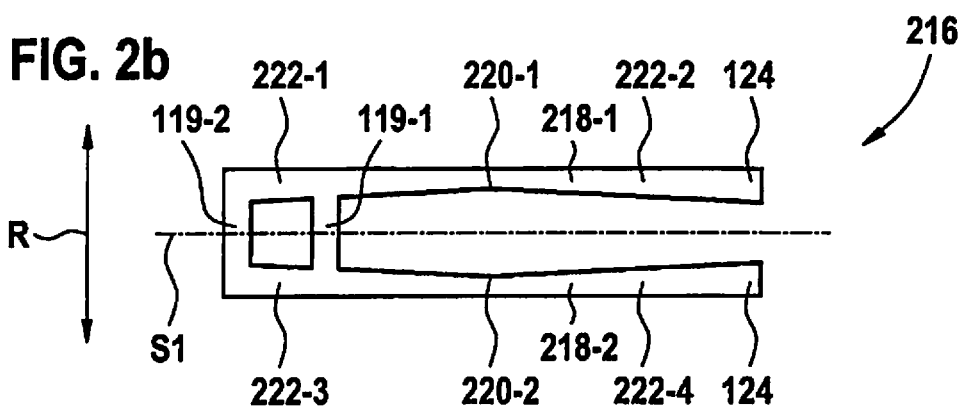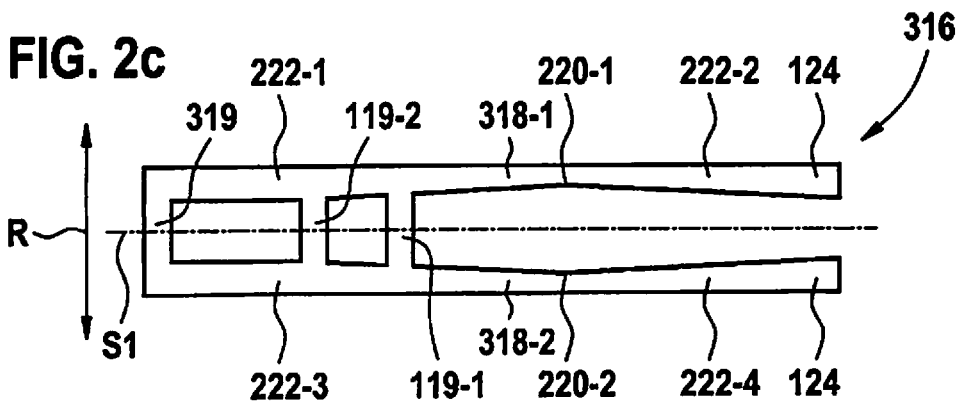

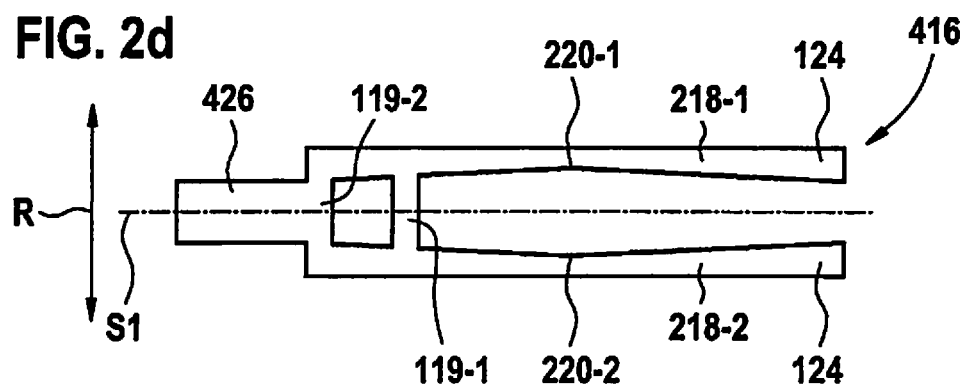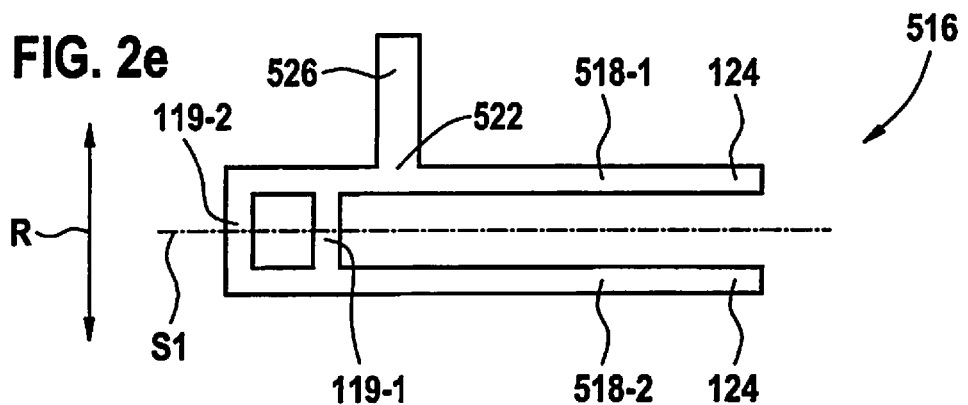

MICROMECHANICAL SPRING DEVICE AND METHOD FOR MANUFACTURING A MICROMECHANICAL SPRING DEVICE

FIELD

The present invention relates to a micromechanical device and to a method for manufacturing a micromechanical device.

BACKGROUND INFORMATION

Oscillating micromechanical devices are frequently operated in resonance, a spring element of the device being resonantly driven and oscillating at a resonance frequency. This makes it possible for micromirrors or other actuators, for example, to be deflected in the desired manner.

A micromechanical spring element is described in PCT Application No. WO 2009 033914 A1.

SUMMARY

The present invention provide a micromechanical device and a method for manufacturing a micromechanical device.

According to a first aspect of the present invention, a micromechanical device is provided, including: a spring element, which is moveably coupleable or moveably coupled to a frame unit at at least one connecting point of the spring element; the spring element including at least one web, which extends starting from the at least one connecting point; and the at least one web being structured in such a way that it includes at least one first section as well as a widening section for reducing a non-linearity of the spring element, which is widened compared to the first section.

A width is understood to mean, in particular, a geometric extension of the web or of the webs in a direction, which is perpendicular to a direction along which the web extends, in a linearly designed web, for example, perpendicular to the length of the web, in a windingly designed web, for example, perpendicular to a tangential direction.

In addition, according to a second aspect of the present invention, a method is provided for manufacturing a micromechanical device, including the step:

designing a spring element, which is moveably coupleable or is moveably coupled to at least one frame unit; the spring element including at least one web, which extends starting from the frame unit; and the at least one web being structured in such a way that it includes at least one first section as well as a widening section for reducing a non-linearity of the spring element, which is widened compared to the first section.

The spring element may, for example, be integrally formed or is to be designed as one piece with the frame unit, so that it is permanently coupled to the frame unit. Alternatively, the spring element may also be joined or is to be joined to the frame unit, for example, affixed or bonded.

SUMMARY

The finding underlying the present invention is that by influencing oscillation modes, also referred to in short as modes, of a resonant micromechanical device by an adapted arrangement of springs and masses, a lower non-linearity of the device is attainable. In this way, an advantageously reduced mode coupling may be achieved.

A reduced mode coupling is intended to mean, in particular, that the natural frequencies of undesirable oscillation modes in the coupled mode spectrum are shifted in such a way that, when exciting a desired oscillation mode, they are not also excited, or are excited only to a minimal extent, for example, less than 5 percent.

Devices having minimal mode coupling may be less sensitive to process tolerances or to varying environmental conditions/assembly conditions or to external excitations. Devices having minimal mode coupling may also be more easily and/or more stably activatable through regulation technology.

The idea underlying the present invention is to take account of this finding and to provide a micromechanical device, in which a mode coupling is reduced or avoided. This is achieved, in particular, using additional masses on the spring element, in particular, in the form of widening sections. The widening sections of the webs of the spring element are more than twenty percent wider as compared to the remaining portion of each web, preferably more than fifty percent wider, in particular, more than one hundred percent wider.

Mode couplings may occur, for example, in conjunction with non-ideal sinusoidal oscillations. These may occur, in particular, in conjunction with devices oscillating with wide deflections. Wide deflections are advantageous, for example, for micromechanical mirror devices, in order to obtain a high deflectability of light beams, or for rotation rate sensors, in order to obtain sufficiently large measuring signals. Square pulses are advantageously used for the excitation of oscillating micromechanical devices. Square pulses are to be provided, controlled and switched by electronics with less effort.

Frequency components having a, in particular, whole-numbered, multiple n*f of a desired resonance frequency f and/or having a product 1/n*f of an inverse 1/n of a whole number n having the desired frequency f occur, in particular, as exciter pulses as a result of the non-ideal sinusoidal oscillations in combination with square pulses. These generated frequency components may excite modes present in the micromechanical device if these modes have an identical or a very similar frequency. Undesirably excited modes may impair the function of the micromechanical device.

The manufacturing method according to the present invention is usable, in particular, for manufacturing a micromechanical device according to one of the preceding specific embodiments, and is adaptable, in particular, according to all described refinements and variants of the micromechanical devices and spring elements.

A frame unit may optionally be or is to be designed as part of the micromechanical device, which is coupled or is to be coupled to the spring element.

Advantageous specific embodiments and refinements are described herein with reference to the figures.

According to one advantageous refinement, the at least one widening section has a greater cross sectional area than the first section of the web. The cross sectional area is understood to be, in particular, situated perpendicular to the direction in which the web extends.

According to another advantageous refinement, the at least one widening section is at least formed partly by a mass unit, which is formed on the web as part of the spring element. A mass unit is understood to mean, in particular, an additional mass, i.e. a mass, which has no effect or only a minimal effect on the stiffness of the spring element, but which increases the total mass of the spring element. A minimal effect is understood to mean, in particular, a relative change in the stiffness, i.e. spring elasticity, of the spring element by less than ten percent, preferably by less than five percent, particularly preferably by less than two percent. Thus, at least one frequency of a natural oscillation of the spring element is advantageously shiftable.

The mass unit may be advantageously situated at a local maximum of a curvature of a respective web, for example, in an area at which the respective web makes a hairpin turn, i.e., changes direction by between 160° and 200°, in particular, by between 170° and 190°.

According to another advantageous refinement, the mass unit leaves the stiffness of the spring element unchanged. Thus, the additional desired properties of the micromechanical device are not affected.

According to another advantageous refinement, the mass unit is designed at least partly, preferably completely, as one piece with the web. This may reduce the technical effort in manufacturing the micromechanical device. Alternatively, the mass unit may also be joined, for example, affixed to or bonded to the web, which may be advantageous in specific embodiments for reasons of efficiency.

According to another advantageous refinement, the spring element includes at least two webs, each having the first section and the at least one widening section, the at least two webs being designed to be symmetrical to one another. According to another advantageous refinement, a micromirror of the micromechanical device is coupled to the spring element. The micromirror is preferably moveably coupled via the spring element to a frame unit of the micromechanical device.

BRIEF DESCRIPTION OF THE DRAWINGS

The present invention is explained in greater detail below with reference to the exemplary embodiments depicted in the schematic figures.

FIG. 2a shows an exemplary spring element 116.

FIG. 2b shows a spring element 216 according to another specific embodiment of the present invention.

FIG. 2c shows a spring element 316 according to yet another specific embodiment of the present invention.

FIG. 2d shows a spring element 416 according to an additional specific embodiment of the present invention.

FIG. 2e shows a spring element 516 according to yet an additional specific embodiment of the present invention.

Figure 1:
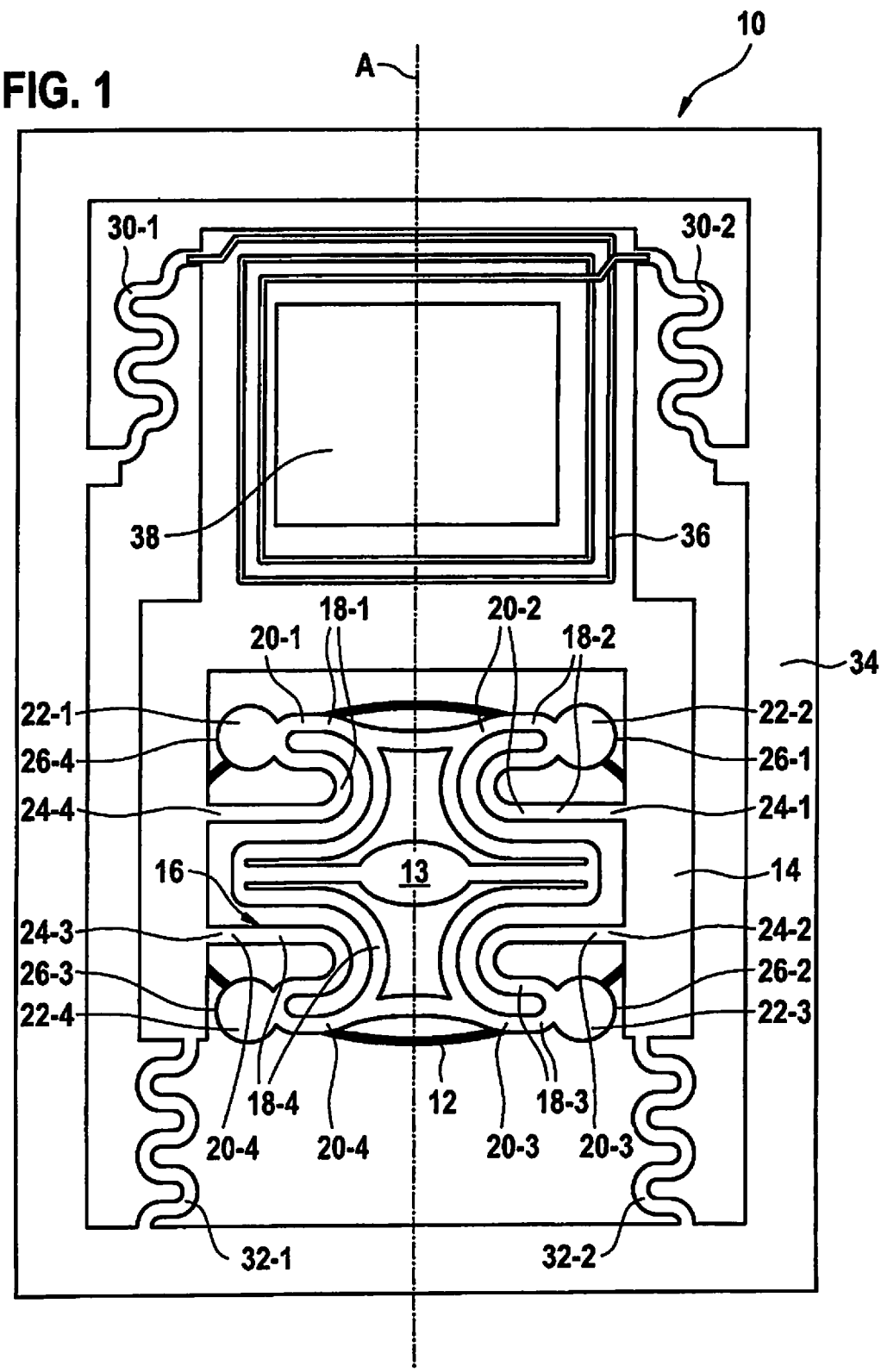
FIG. 1 schematically shows a top view of a micromechanical device 10 according to one specific embodiment of the present invention.

In all figures, identical or functionally identical elements and devices are provided with the same reference numeral, unless indicated otherwise. The numbering of the method steps is for purposes of clarity and is not intended to imply a particular chronological sequence, unless indicated otherwise. Multiple method steps may, in particular, also be carried out simultaneously.

DETAILED DESCRIPTION OF EXAMPLE EMBODIMENTS

FIG. 1 schematically shows a top view of a micromechanical device 10 according to one specific embodiment of the present invention.

The micromechanical device 10 includes a micromirror 12, the reflective surface of which points in FIG. 1 into the sheet. Micromirror 12 includes a base, which connects a mirror disk of micromirror 12, on which the reflecting surface is formed, to an anchoring point 13. Anchoring point 13 is connected to a frame unit 14 via a spring element 16.

In particular, anchoring point 13 is connected to frame unit 14 via four webs 18-1, 18-2, 18-3, 18-4 of spring element 16, which are referred to below combined in short as 18-i.

Each of webs 18-i includes two first sections 20-1, 20-2, 20-2, 20-3, 20-4 each and in each case a widening section 22-1, 22-2, 22-3, 22-4 situated between the first two sections 20-1, 20-2, 20-2, 20-3, 20-4. First sections 20-1, 20-2, 20-2, 20-3, 20-4 are referred to below in short as 20-i. The widening sections 22-1, 22-2, 22-3, 22-4 are referred to below in short as 22-i. In device 10 according to FIG. 1, the widening sections are roughly disk-shaped, the corresponding disk being connected at an area of its outer circumference to respective web 18-i.

The widening sections 22-i each apply additional mass to spring element 16. Widening sections 22-i may therefore also be referred to as mass elements or as additional masses. The stiffness of spring element 16 is not altered or altered only insignificantly by widening sections 22-i. Widening sections 22-i advantageously alter a natural frequency and/or a natural frequency spectrum of spring element 16 in such a way that natural frequencies of undesirable oscillation modes are shifted, advantageously away from a natural frequency of a desired oscillation mode of the spring element.

In FIG. 1, frame unit 14 is fixedly connected to an electrical coil unit 36, which is energizable with electric current. If coil unit 36 is situated in the magnetic field of a permanent magnet, which may also be part of micromechanical device 10, a resonant movement of coil unit 36, which results in a resonant movement of micromirror 12 via frame unit 14, webs 18-i and anchoring point 14, may be generated by correspondingly energizing coil unit 36 with electric alternating current. To reduce the weight of coil unit 36, the unit is designed with a cavity 38 inside of windings of coil unit 36.

In the area of coil unit 36, micromechanical device 10 is moveably connected to a border 34 of micromechanical device 10 via a first and a second flexible and compressible spacer 30-1, 30-2. In the area of frame unit 14, micromechanical device 10 is moveably connected to border 34 via a third and a fourth flexible and compressible spacer 32-1, 32-2. First through fourth spacers 30-1, 30-2, 32-1, 32-2 each advantageously are formed as multiple sinuous S-shapes.

Frame unit 14, webs 18-i, anchoring point 13, first through fourth spacers 30-1, 30-2, 32-1, 32-2, border 34 and cavity 38 are designed advantageously axially symmetrically relative to an axis of symmetry A.

FIG. 2a shows an exemplary spring element 116, which includes two webs 118-1, 118-2, which are each connectable or are connected to a frame unit not depicted via a connecting point 124 of respective web 118-1, 118-2. The frame unit may, for example, be a fixing, a mass or an actuator. Spring element 116 includes a first cross web 119-1 and a second cross web 119-2, each of which extends between the two webs 118-1, 118-2. Second cross web 119-2 connects one end each of webs 118-1, 118-2 facing away from respective connecting point 124 to one another.

First cross web 119-1 is formed on each web 118-1, 118-2, in each case between the end of respective web 118-1, 118-2, first cross web 119-1 being situated closer to second cross web 119-2 than to connecting points 124, in particular, closer to second cross web 119-2 than to the center between the two ends of each web 118-1, 118-2. Spring element 116 is designed to oscillate along a functional direction R, which is situated preferably in parallel to first cross web 19-1 and/or to second cross web 119-2.

FIG. 2b shows a spring element 216 according to another specific embodiment of the present invention. Spring element 216 is a variant of spring element 116.

Webs 218-1, 218-2 as well as first cross web 119-1 and second cross web 119-2 of spring element 216 are designed axially symmetrically relative to an axis of symmetry S1. Each of webs 218-1, 218-2 tapers starting from respective connecting point 124 in the direction of first cross web 119-1, initially to a narrowest point 220-1, 220-2 of each web 118-1, 118-2 and widens from there toward second cross web 119-2. Narrowest point 220-1, 220-2 is also called the kink height. The other areas of webs 118-1, 118-2 opposite narrowest point 220-1, 220-2 represent widening areas 222-1, 222-2, 222-3, 222-4, which combined are referred to as 222-i. The tapering and/or the widening of webs 118-1, 118-2 may be formed stepwise, according to a pattern used during a manufacturing method.

By designing narrowest point 220-1, 220-2 at a point not loaded by stress or loaded only minimally by stress, the natural frequency of spring element 216 is shiftable in a favorable manner, i.e., is adaptable. Any change in stiffness of the spring resulting from the corresponding design along functional direction R may be compensated for by a change in length of spring element 216, i.e., in particular, by a change in length of webs 218-1, 218-2. In this way, an advantageous shift of the natural frequency and/or a reduction of the mode coupling of spring element 216 is achievable without an accompanying change in stiffness, i.e., a change of spring elasticity, of spring element 216.

FIG. 2c shows a spring element 316 according to yet another specific embodiment of the present invention. Spring element 316 is a variant of spring element 216. Spring element 316 is designed initially like spring element 216. However, webs 318-1, 318-[sic] of spring element 316, unlike spring element 216, are designed in such a way that second cross web 119-2 is not formed at the ends of webs 318-1, 318-2. Instead, webs 318-1, 318-2 extend further beyond second cross web 119-2 and are connected at their ends facing away from connecting points 124 by a third cross web 319. Third cross web 319 is also designed axially symmetrically relative to axis of symmetry S1.

Spring element 316 is designed identically to spring element 216 in the area between connecting points 124 and third cross web 319. The width of webs 318-1, 318-2 preferably does not change between second cross-web 119-2 and third cross web 319.

FIG. 2d shows a spring element 416 according to an additional specific embodiment of the present invention. Spring element 416 is a variant of spring element 216 and differs from spring element 216 in that an additional mass 426 is situated at an edge of second cross web 119-2 facing away from connecting points 124, which is also designed axially symmetrically relative to axis of symmetry S1. Additional mass 426 may, for example, have a cuboid-shaped or disk-shaped design.

FIG. 2e shows a spring element 516 according to yet an additional specific embodiment of the present invention. Spring element 516 is a variant of spring element 116 and differs from spring element 116 in that an additional mass 526, which forms a widening section 522 on first web 518-1, is formed on a first web 518-1, which is otherwise designed identically to a first web 118-1 of spring element 116. Additional mass 526 may, for example, have a cuboid-shaped or disk-shaped design. Additional mass 526 is, in particular, not designed symmetrically relative to axis of symmetry S1 of webs 518-1, 118-2.

The present invention, although it was described with reference to preferred exemplary embodiments, is not limited to these, but is modifiable in a variety of ways. The invention may, in particular, be changed or modified in various ways, without deviating from the core of the present invention.

What is claimed is:

1. A micromechanical device, comprising:
   a spring element, which is moveably coupleable or moveably coupled to a frame unit at at least one connecting point of the spring element, the spring element including at least one web which extends starting from the at least one connecting point;
   wherein the at least one web is structured in such a way that it includes at least one first section and at least one widening section for reducing a non-linearity of the spring element, which is widened compared to the first section;
   wherein the at least one web has a structure that is non-linear.

2. The device as recited in claim 1, wherein the at least one widening section has a greater cross sectional area than the first section.

3. The device as recited in claim 1, wherein the at least one widening section is formed at least partly by a mass unit, which is formed on the web as part of the spring element.

4. The device as recited in claim 3, wherein the mass unit leaves a stiffness of the spring element unchanged.

5. The device as recited in claim 3, wherein the mass unit is formed at least partly as one piece with the web.

6. The device as recited in claim 3, wherein the mass unit is disk-shaped.

7. The device as recited in claim 3, wherein the mass unit is cuboid-shaped.

8. The device as recited in claim 1, wherein the spring element includes at least two webs, each having the first section and the at least one widening section, the at least two webs being axially symmetrical to one another relative to an axis of symmetry.

9. The device as recited in claim 1, wherein the spring element is coupled to a micromirror of the micromechanical device.

10. The device as recited in claim 9, wherein an anchoring point is connected to the micromirror and is connected to the frame unit via the spring element.

11. A method for manufacturing a micromechanical device, comprising:
    designing a spring element, which is moveably coupleable or is moveably coupled to at least one frame unit at at least one connecting point of the spring element, the spring element including at least one web, which extends starting from the at least one connecting point;
    wherein the at least one web is structured in such a way that it includes at least one first section and at least one widening section for reducing a non-linearity of the spring element, which is widened compared to the first section;
    wherein the at least one web has a structure that is non-linear.

12. The method as recited in claim 11, wherein the at least one web has a structure that is non-linear.

13. The method as recited in claim 11, wherein an anchoring point is connected.

* * * * *